United States Patent
Hao

(10) Patent No.: US 11,698,398 B2
(45) Date of Patent: Jul. 11, 2023

(54) INTELLIGENT ELECTRONIC DEVICE CONTROL USING WIRELESSLY TRANSMITTED MULTI-PHASE ELECTRICAL MEASUREMENTS

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 50 days.

(21) Appl. No.: 17/584,556

(22) Filed: Jan. 26, 2022

(65) Prior Publication Data

US 2022/0146557 A1    May 12, 2022

Related U.S. Application Data

(62) Division of application No. 16/742,356, filed on Jan. 14, 2020, now Pat. No. 11,268,995.

(Continued)

(51) Int. Cl.
   *G01R 22/06*    (2006.01)
   *H04Q 9/04*    (2006.01)
   *H02J 13/00*    (2006.01)

(52) U.S. Cl.
   CPC ...... *G01R 22/063* (2013.01); *H02J 13/00002* (2020.01); *H02J 13/00022* (2020.01);
   (Continued)

(58) Field of Classification Search
   CPC ...... G01R 22/063; G01R 15/26; G01R 15/18; G01R 19/2513; H02J 13/00002; H02J 13/00022; H02J 3/1821; H02J 13/00026; H04Q 9/04; H04Q 2209/40; H04Q 2213/1316; H04Q 9/00; Y02E 40/30; Y02E 40/70; Y02E 60/00; Y04S 10/18; Y04S 10/22; Y04S 10/30; Y04S 40/126
   See application file for complete search history.

(56) References Cited

U.S. PATENT DOCUMENTS 5,075,565 A * 12/1991 Severinsky ............. H02J 9/062
                                                        307/66
6,104,707 A *  8/2000 Abraham ................. H04B 3/56
                                                     340/310.17
(Continued)

*Primary Examiner* — Amine Benlagsir
(74) *Attorney, Agent, or Firm* — Fletcher Yoder, P.C.; Richard M. Edge

(57) ABSTRACT

Systems, methods, and devices are provided for controlling part of an electric power distribution system using an intelligent electronic device that may rely on communication from wireless electrical measurement devices. Wireless electrical measurement devices associated with different phases of power on an electric power distribution system may send wireless messages containing electrical measurements for respective phases to an intelligent electronic device. When wireless communication with one of the wireless electrical measurement devices becomes inconsistent or lost, the intelligent electronic device may synthesize the electrical measurements of the missing phase using electrical measurements of remaining phases. The intelligent electronic device may use the synthesized electrical measurements to control part of the electric power distribution system.

8 Claims, 9 Drawing Sheets

Related U.S. Application Data

(60) Provisional application No. 62/914,326, filed on Oct. 11, 2019.

(52) U.S. Cl.
CPC ........... *H04Q 9/04* (2013.01); *H04Q 2209/40* (2013.01); *H04Q 2213/1316* (2013.01)

(56) References Cited

U.S. PATENT DOCUMENTS

| | | | |
|---|---|---|---|
| 6,353,668 B1* | 3/2002 | Akhteruzzaman .. | H04M 19/001 379/93.05 |
| 2010/0226159 A1* | 9/2010 | Stern ................... | H02M 7/5395 363/132 |
| 2012/0049633 A1* | 3/2012 | Leadingham ......... | H02M 5/458 307/80 |
| 2012/0051104 A1* | 3/2012 | Ohshima ............... | H02M 7/219 363/84 |
| 2012/0161513 A1* | 6/2012 | Ohshima ............... | H02M 7/217 363/44 |
| 2012/0194144 A1* | 8/2012 | Koren ..................... | H02J 3/28 323/212 |
| 2013/0277974 A1* | 10/2013 | Klatt ....................... | F16H 7/023 474/148 |
| 2016/0266221 A1* | 9/2016 | Hanada ................. | G01R 33/561 |
| 2016/0359325 A1* | 12/2016 | Kawata ............... | H04L 12/2829 |
| 2017/0047463 A1* | 2/2017 | Hajimiri ................ | B64G 1/428 |
| 2017/0272016 A1* | 9/2017 | Fukumaru ............... | H02P 27/08 |
| 2019/0383869 A1 | 12/2019 | Achanta | |

* cited by examiner

INTELLIGENT ELECTRONIC DEVICE CONTROL USING WIRELESSLY TRANSMITTED MULTI-PHASE ELECTRICAL MEASUREMENTS

CROSS REFERENCE TO RELATED APPLICATIONS

This application claims the benefit of priority under 35 U.S.C. § 119 as a divisional application of U.S. patent application Ser. No. 16/742,356, filed on 14 Jan. 2020, and entitled "Intelligent Electronic Device Control Using Wirelessly Transmitted Multi-Phase Electrical Measurements," which claims the benefit of priority under 35 U.S.C. § 119(e) to U.S. Provisional Patent Application No. 62/914,326, filed on Oct. 11, 2019, and entitled "Intelligent Electronic Device Control Using Wirelessly Transmitted Multi-Phase Electrical Measurements," the contents of each are hereby incorporated by reference.

BACKGROUND

This disclosure relates to controlling an electric power distribution system. More particularly, this disclosure relates to operating intelligent electrical devices (IEDs) using wireless measurement devices, such as wireless current sensors (WCSs), within the electric power distribution system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power distribution systems carry electricity from a transmission system to residential communities, factories, industrial areas, and other electricity consumers. Current transformers may be used to reduce higher-voltage currents to lower values, enabling measurements of the electrical current flowing through transmission lines. Current transformers may provide these measurements to IEDs for applications such as protective relaying, electrical load surveying, verification of circuit energization, cost allocation, capacitor bank control, and demand alarming. Wireless current transformers are a particular type of current transformer that may obtain current measurements and wirelessly transmit the measurements to an intelligent electronic device (IED) Some wireless current sensors may operate using energy harvested from a transmission line, allowing them to operate without separate electrical wiring to a power source and/or without a battery or using a relatively smaller battery. Thus, unlike wired current sensors, which are powered by electrical wiring and tend to be located near an IED, wireless current sensors may offer greater flexibility. However, a loss of power on the transmission line or certain wireless interference conditions could cause a wireless current sensor to stop sending wireless signals. In that case, an IED may not receive current measurements from the wireless current sensor.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In one example, a system includes a first wireless electrical measurement device, a second wireless electrical measurement device, and an intelligent electronic device that controls an electrical component of an electric power distribution system. The first wireless electrical measurement device may obtain electrical measurements of a first phase on a first distribution line of the electric power distribution system and wirelessly transmit first messages containing the electrical measurements of the first phase to the intelligent electronic device. The second wireless electrical measurement device may obtain electrical measurements of a second phase on a second distribution line of the electric power distribution system and wirelessly transmit second messages containing the electrical measurements of the second phase to the intelligent electronic device. The intelligent electronic device may receive the first messages from the first wireless electrical measurement device and the second messages from the second wireless electrical measurement device, determine a consistency of wireless communication from the first wireless electrical measurement device based at least in part on the first messages and of the second wireless electrical measurement device based at least in part on the second messages. In response to determining that the communication from the first wireless electrical measurement device is presently consistent but that the communication from the second wireless electrical measurement device is not presently consistent, the intelligent electronic device may synthesize the electrical measurements of the second phase based at least in part on the electrical measurements of the first phase. The intelligent electronic device may use the electrical measurements of the first phase and the synthesized electrical measurements of the second phase to control the electrical component of the electric power distribution system.

In another example, tangible, non-transitory, computer-readable media may include instructions that, when executed by a processor of an intelligent electronic device that controls at least part of an electrical distribution system, cause the processor to operate the intelligent electronic device in at least a first mode or a second mode. The intelligent electronic device may operate according to a first mode when the intelligent electronic device has wireless communication with a first wireless electrical measurement device that obtains electrical measurements of a first phase on a first distribution line of the electric power distribution system, a second wireless electrical measurement device that obtains electrical measurements of a second phase on a second distribution line of the electric power distribution system, and a third wireless electrical measurement device that obtains electrical measurements of a third phase on a third distribution line of the electric power distribution system. The intelligent electronic device may operate according to a second mode when the intelligent electronic device has lost wireless communication with one of the first wireless electrical measurement device, the second wireless electrical measurement device, and the third wireless electrical measurement device while remaining in wireless communication with two of the first wireless electrical measurement device, the second wireless electrical measurement device, and the third wireless electrical measurement device.

In another example, an intelligent electronic device includes processing circuitry, a communication system, and a memory device. The memory device includes instructions that cause the processing circuitry to receive first wireless messages that include electrical current measurements of a first phase on a first conductor of an electric power distribution system, receive second wireless messages that include electrical current measurements of a second phase on a second conductor of the electric power distribution system, and receive third wireless messages that include electrical current measurements of a third phase on a third conductor of the electric power distribution system. While the first wireless messages are presently being consistently received, the second wireless messages are presently being consistently received, and the third wireless message are presently being consistently received, the instructions cause the intelligent electronic device to operate in a first mode to control an electrical component of the electric power distribution system. In response to determining that the first wireless messages are not presently being consistently received, that the second wireless messages are presently being consistently received, and that the third wireless message are presently being consistently received, the instructions cause the intelligent electronic device to operate in a second mode to control the electrical component of the electric power distribution system. Operating in the second mode includes synthesizing the electrical current measurements of the first phase based at least in part on the electrical current measurements of the second phase or the electrical current measurements of the third phase. In one example, the intelligent electronic device may determine that the first and/or second wireless messages are not presently being consistently received based on determining whether the wireless communication from the first and/or second wireless electrical measurement devices and the intelligent electronic device has paused or stopped (e.g., has been interrupted).

DETAILED DESCRIPTION

Figure 1:
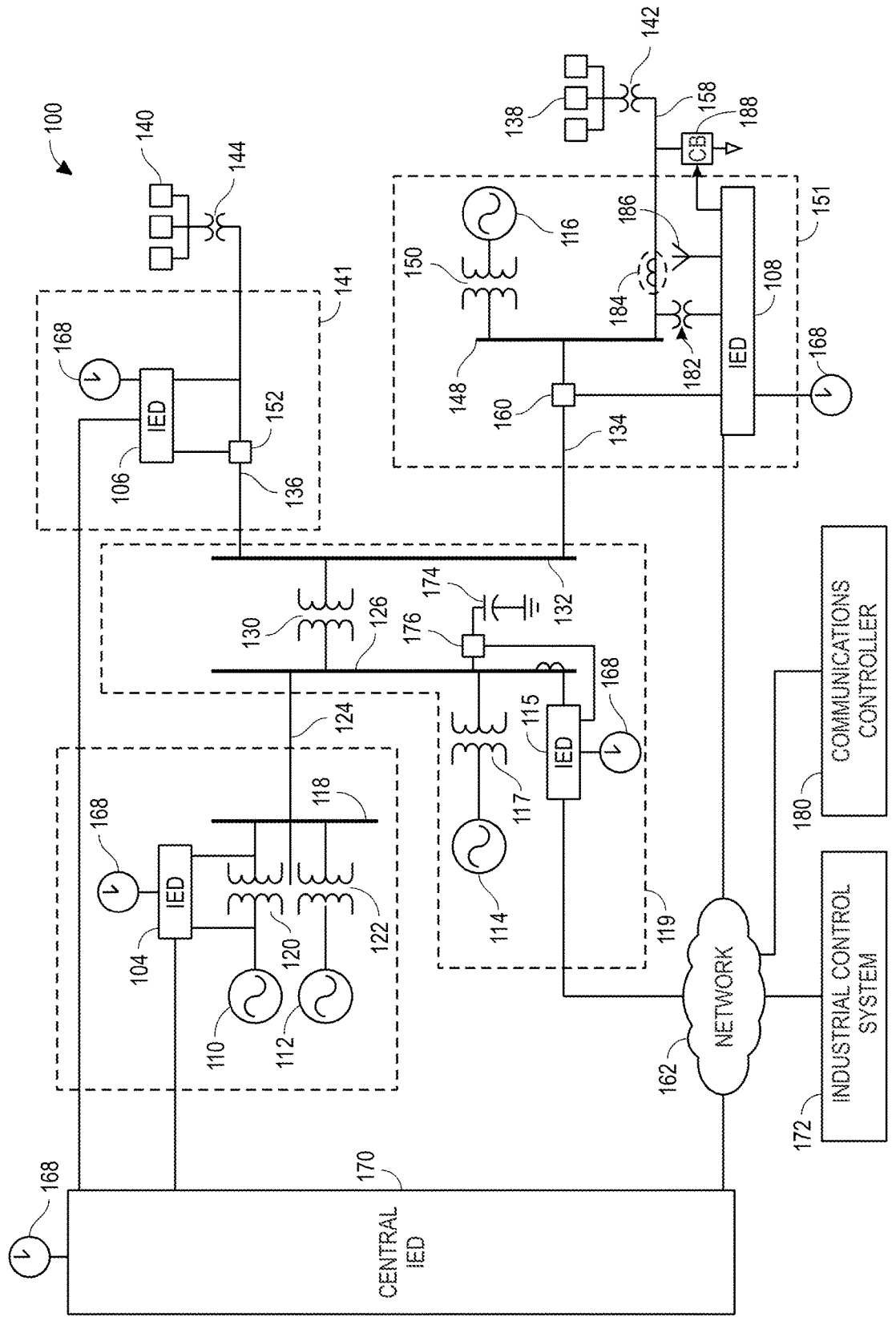
FIG. 1 is a simplified diagram of an electric power distribution system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Moreover, the embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Intelligent electronic devices (IEDs) may be used to control certain devices on an electric power distribution system. In examples discussed below, an IED may be a capacitor bank controller that controls a capacitor bank on an electric power distribution system. However, it should be appreciated that the systems and methods of this disclosure may employ any suitable IED to control any suitable device to control an aspect of an electric power distribution system. Thus, where the disclosure below refers to a capacitor bank controller that uses the systems and methods of this disclosure, this should be understood to encompass any other suitable IEDs to control any other suitable devices for an electric power distribution system. Likewise, where the disclosure refers to wireless current sensors (WCSs) that may provide current measurements, this should be understood to encompass any other suitable electrical measurement devices that wirelessly transmit electrical measurements in wireless messages.

As mentioned above, one type of electrical measurement device is a current sensor. A current sensor may be used to reduce higher-voltage currents to lower values, enabling measurements of the electrical current flowing through transmission lines. Current sensors may provide these measurements to IEDs for applications such as protective relaying, electrical load surveying, verification of circuit energization, cost allocation, capacitor bank control, and demand alarming. Some wireless current sensors may operate using energy harvested from a transmission line, allowing them to operate without separate electrical wiring to a power source and/or without a battery or using a relatively smaller battery. Thus, unlike wired current sensors, which are powered by electrical wiring and tend to be located near an IED, wireless current sensors may offer greater flexibility. However, a loss of power on the transmission line or certain wireless interference conditions could cause a wireless current sensor to stop sending wireless signals. In such an event of interrupted wireless communication, an IED may not receive current measurements from the wireless current sensor.

This disclosure describes systems and methods to identify and mitigate potential losses of wireless signals containing electrical measurements for use by an IED. Indeed, an IED may identify a pattern in the rate at which wireless messages are sent to the IED from a wireless electrical measurement device, such as a wireless current sensor (WCS). For example, the IED may identify an expected wireless message arrival time for a wireless message providing an electrical measurement. The expected wireless message arrival time may change as conditions in the power distribution system change. Indeed, in a case where the wireless electrical measurement device gleans power for transmitting the wireless messages from the power distribution system itself, the rate of wireless messages may depend on the present amount of power transmitted by the power distribution system. For example, the transmission rate of wireless messages may be higher when an electrical current transmitted by the electric power distribution system is higher, and the transmission rate of wireless messages may be lower when the electrical current transmitted by the electric power distribution system is lower. Thus, it may not be appropriate in some situations to assume that the expected wireless message arrival time will remain static; indeed, it may change as conditions in the power distribution system change. Accordingly, the IED may determine the expected wireless message arrival time dynamically. In one example, the expected wireless message arrival time may be an average (e.g., a weighted average) based on the arrival intervals of some number of recent wireless messages.

To identify whether wireless communication from the wireless electrical measurement device and the IED has paused or stopped (e.g., has been interrupted), the IED may start a timer when a new message arrives. The timer may be set to expire at some multiple of the expected wireless message arrival time (e.g., 2 x). If the timer expires before the next message is received, this may indicate that communication with the wireless electrical measurement device is paused or has stopped (e.g., has been interrupted). This could mean that the previously received measurements from the wireless electrical measurement device may no longer represent the present electrical values on the electrical distribution system (for example, if the current was previously flowing on a distribution line and now has stopped). As such, the IED may determine to stop using the previously received electrical measurements or may determine to weight the previously received electrical measurements less in calculations it performs. Indeed, in some cases, the IED may operate according to a different operational mode (e.g., control method) depending on whether presently sufficiently recent communication with a wireless electrical measurement device is available. In one particular example, a capacitor bank controller may control a capacitor bank using a first control method based on both voltage and current while communication is consistent with a wireless current sensor providing present measurements of the current. When the communication with the wireless current sensor changes suddenly (e.g., suddenly slows, stops or pauses), however, the capacitor bank controller may control the capacitor bank using a second control method based on voltage instead of current.

Some IEDs may receive electrical measurements from several wireless electrical measurement devices measuring different respective phases of electric power. For example, three-phase electric power may be transmitted by three respective transmission lines. Three-phase power generally involves three alternating-current (AC) electrical waveforms that are offset from one another in phase by about 120°. The three-phase power waveforms are generally similar to one another, though there may be some variation in magnitude or harmonics from phase to phase. Certain IEDs, such as a capacitor bank controller, may control an electrical component of the power distribution system, such as a capacitor bank, based on the present state of all three phases of power. Thus, loss of communication with one of the wireless electrical measurement devices may prevent the IED from receiving updated electrical measurements for that phase of power.

Rather than avoid using the remaining electrical measurements from the wireless electrical measurement devices that remain in wireless communication with the IED, the IED may use the remaining electrical measurements to synthesize the missing wireless electrical measurements. For example, the IED may initially receive wireless electrical measurements for three phases of power (e.g., phase A, phase B, and phase C). The IED may lose wireless communication with one of the phases (e.g., phase B). In that case, the IED may no longer be receiving electrical measurements of that phase (e.g., phase B), but may still receive measurements of the remaining phases (e.g., phase A and phase C). The IED may synthesize the electrical measurements of the missing phase (e.g., phase B) based on the measurements of the remaining phases (e.g., phase A and phase C). For example, the IED may synthesize the missing phase as an average magnitude of the remaining phases. The IED may, in some cases, take into account a historical relationship between the phases (e.g., the magnitude of phase B was historically 10% higher than that of phase A and phase C, or that phase B historically exhibited certain harmonics) to synthesize the missing phase.

FIG. 1 illustrates a simplified diagram of an electric power distribution system 100 that may use changes in wireless communication rates to determine whether to operate an IED using measurements from a wireless electrical measurement device. The electric power distribution system 100 may generate, transmit, and/or distribute electric energy to loads. As illustrated, the electric power distribution system 100 includes electric generators 110, 112, 114, and 116. The electric power distribution system 100 may also include power transformers 117, 120, 122, 130, 142, 144, and 150. Furthermore, the electric power delivery system may include lines 124, 134, 136, and 158 to transmit and/or deliver power, circuit breakers 152, 160, and 176 to control flow of power in the electric power distribution system 100, busses 118, 126, 132, and 148, and/or loads 138 and 140 to receive the power in and/or from the electric power distribution system 100. A variety of other types of equipment may also be included in electric power distribution system 100, such as current sensors (e.g., wireless current sensor (WCS) 184), potential transformers (e.g., potential transformer 182), voltage regulators, capacitors (e.g., capacitor 174) and/or capacitor banks (e.g., capacitor bank (CB) 188), antennas (e.g., antenna 186), and suitable other types of equipment useful in power generation, transmission, and/or distribution.

A substation 119 may include the electric generator 114, which may be a distributed generator, and which may be connected to the bus 126 through the power transformer 117 (e.g., step-up transformer). The bus 126 may be connected to a distribution bus 132 via the power transformer 130 (e.g., step-down transformer). Various distribution lines 136 and 134 may be connected to the distribution bus 132. The distribution line 136 may lead to a substation 141 where the distribution line 136 is monitored and/or controlled using an IED 106, which may selectively open and close circuit breaker 152. A load 140 may be fed from distribution line 136. The power transformer 144 (e.g., step-down transformer), in communication with the distribution bus 132 via distribution line 136, may be used to step down a voltage for consumption by the load 140.

A distribution line 134 may deliver electric power to a bus 148 of the substation 151. The bus 148 may also receive electric power from a distributed generator 116 via transformer 150. The distribution line 158 may deliver electric power from the bus 148 to a load 138, and may include the power transformer 142 (e.g., step-down transformer). A circuit breaker 160 may be used to selectively connect the bus 148 to the distribution line 134. The IED 108 may be used to monitor and/or control the circuit breaker 160 as well as the distribution line 158.

The electric power distribution system 100 may be monitored, controlled, automated, and/or protected using IEDs such as the IEDs 104, 106, 108, 115, and 170, and an industrial control system 172. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 104, 106, 108, 115, and 170) may refer to any processing-based device that monitors, controls, automates, and/or protects monitored equipment within the electric power distribution system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular).

A common time signal may be distributed throughout the electric power distribution system 100. Utilizing a common time source may ensure that IEDs have a synchronized time signal that can be used to generate time synchronized data, such as synchrophasors. In various embodiments, the IEDs 104, 106, 108, 115, and 170 may receive a common time signal 168. The time signal may be distributed in the electric power distribution system 100 using a communications network 162 and/or using a common time source, such as a Global Navigation Satellite System ("GNSS"), or the like.

According to various embodiments, the industrial control system 172 may include one or more of a variety of types of systems. For example, the industrial control system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a communications network 162. According to various embodiments, some IEDs may be in direct communication with other IEDs. For example, the IED 104 may be in direct communication with the central IED 170. Additionally or alternatively, some IEDs may be in communication via the communications network 162. For example, the IED 108 may be in communication with the central IED 170 via the communications network 162.

Communication via the communications network 162 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power distribution system 100.

A communications controller 180 may interface with equipment in the communications network 162 to create a software-defined network (SDN) that facilitates communication between the IEDs 170, 115, and, 108 and the industrial control system 172. In various embodiments, the communications controller 180 may interface with a control plane (not shown) in the communications network 162. Using the control plane, the communications controller 180 may direct the flow of data within the communications network 162.

The communications controller 180 may receive information from multiple devices in the communications network 162 regarding transmission of data. In embodiments in which the communications network 162 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 162 includes electrical communication links, the data collected by the communications controller 180 may include voltage measurements, signal-to-noise ratio characteristics, packet loss statics, and the like. In some embodiments, the communications network 162 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Some IEDs, such as the IED 108, may receive wireless messages from a wireless electrical measurement device, such as the wireless current sensor (WCS) 184. A wireless electrical measurement device such as the wireless current sensor (WCS) 184 may include a processor and non-transitory computer-readable media that may store instructions that, when executed by the processor, cause the processor to obtain the electrical measurements and transmit them wirelessly to an IED, such as the IED 108. To that end, the wireless current sensor (WCS) 184 may include a current transformer, a metering circuit, and a communication system to wireless transmit measurements. The current transformer of the wireless current sensor (WCS) 184 may include a coil that may be looped around one phase of a distribution line (such as the distribution line 158). The electrical current measurement of distribution line 158 may be obtained by measuring the electrical current induced in the coil of the current transformer using the metering circuitry; the induced current is proportional to the current flowing through the measured phase of the distribution line 158. In this way, the wireless current sensor (WCS) 184 may measure an electrical current of an electrical waveform carried by the distribution line 158. For example, the wireless current sensor (WCS) 184 may measure a current magnitude and a zero crossing of an alternating current (AC) electrical waveform on the distribution line 158. In some cases, there may be as many wireless current sensors (WCSs) 184 as there are phases of electrical power on the distribution line 158.

The wireless current sensor (WCS) 184 may send the electrical measurements as wireless messages to the IED 108 via an antenna 186. The IED 108 may also use a time signal 168 to help the IED 108 assess arrival times of the wireless messages received by the IED 108 from the wireless current sensor (WCS) 184. The wireless messages may take any suitable form and may be transmitted using any suitable protocol. To conserve bandwidth, in some embodiments, the wireless messages may contain a representation of the current magnitude measurement and may be sent at a particular time based on a time of a zero crossing measurement. In one example, the wireless current sensor (WCS) 184 may transmit a wireless message immediately upon a zero crossing, so that the IED 108 may identify the zero crossing based on the arrival time of the wireless message. In another example, the wireless current sensor (WCS) 184 may transmit a wireless message just prior to a zero crossing, so that the arrival time of the wireless message at the IED 108—taking into account latencies of message transmission and receipt—is expected to represent the present zero crossing of the electrical current carried on the distribution line 158.

In some embodiments, the IED 108 may operate as a capacitor bank controller (CBC) that may control a capacitor bank (CB) 188. The capacitor bank (CB) 188 may represent an electrical component of the power distribution system 100 that contains capacitors that can be selectively switched to connect to the distribution line 158. Because the capacitors of the capacitor bank (CB) 188 introduce a reactive load to the distribution line 158 when connected to the distribution line 158, the IED 108 may control the switching of the capacitors of the capacitor bank (CB) 188 to control, for example, a power factor and/or phase shift on the distribution line 158. In addition to current measurements from the wireless current sensor (WCS) 184, the IED 108 may also receive voltage measurements from a potential transformer 182.

Figure 2:
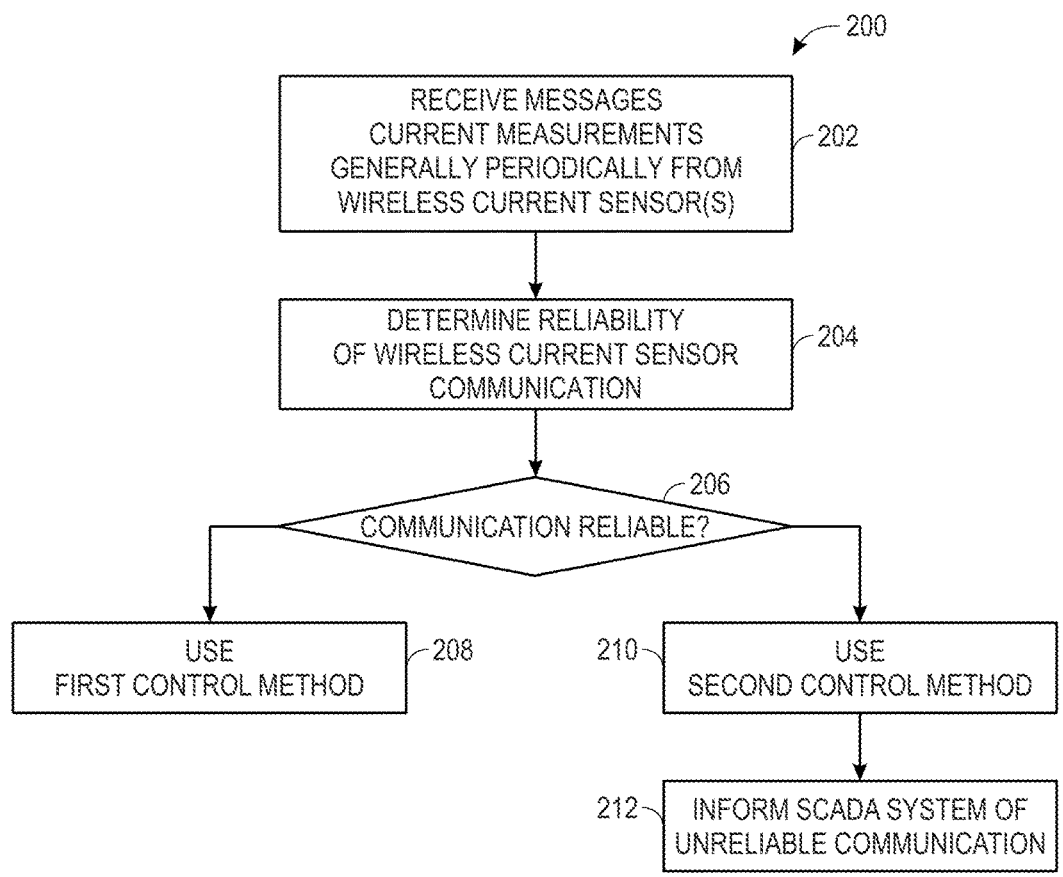
FIG. 2 is a block diagram of a wireless current sensor in communication with a capacitor bank controller of the electric power distribution system, in accordance with an embodiment.

As noted above, there may be as many wireless current sensors (WCSs) 184 as there are phases of electrical power on the distribution line 158. For example, as shown by a three-phase arrangement 190 in FIG. 2, there may be three wireless current sensors (WCSs) 184A, 184B, and 184C that measure electrical current on three respective phases A, B, and C carried by different conductors of the distribution line 158 (158A, 158B, and 158C). There may also be three corresponding potential transformers 182A, 182B, and 182C to obtain voltage measurements for the three respective phases A, B, and C. In FIG. 2, the IED 108 is shown to represent a capacitor bank controller (CBC) 192 that may receive wireless messages from the wireless current sensors (s) 184A, 184B, and 184C via its antenna 186. Thereafter, the IED 108 (capacitor bank controller (CBC) 192) may use any suitable control method to issue control signals 194 to control the capacitor bank (CB) 188. Some control methods (i.e., VAR control method, power factor control method) may take into account both the voltage measurements from the potential transformers 182 and the current measurements from the wireless current sensors (WCSs) 184 to control a power factor or phase shift on the distribution lines 158A, 158B, and 158C, while other control methods may be static (e.g., based on a programmed schedule associated with the date and/or time of day) or may use voltage measurements but not current measurements.

Different IED modes or operation (e.g., control methods) may be more or less effective under different circumstances. In general, a control method that uses both voltage and current measurements may be more effective than a control method that uses only voltage measurements or that is static. This may not be the case, however, if the current or voltage measurements no longer represent the present conditions on the electric power distribution system. Thus, an IED receiving wireless measurements from a wireless electrical measurement device may select a particular control method depending at least in part on the consistency of the rate of the wireless messages.

Figure 3:
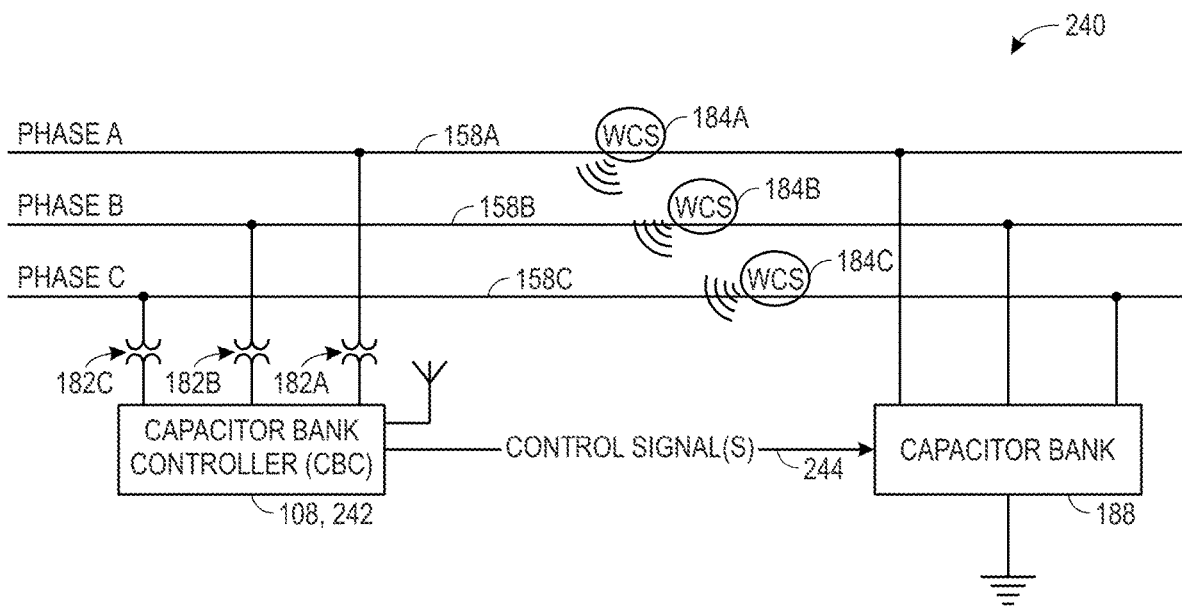
FIG. 3 is a flowchart of a process used to determine an operation mode for operating an TED based on communication sent from a wireless electrical measurement device such as a wireless current sensor, in accordance with an embodiment.

FIG. 3 is a flow chart of a process 200 by which a particular control method may be selected using a consistency of a rate of wireless communication messages from the wireless current sensor (WCS) 184 to the IED 108. The process 200 begins as the IED 108 receives wireless messages indicating electrical current measurements from the wireless current sensor (WCS) 184 (block 202). The wireless messages may be received generally periodically if the wireless connection between the wireless current sensor (WCS) 184 and the IED 108 is uninterrupted and electrical current is flowing on the distribution line 158 (if the wireless current sensor (WCS) 184 is harvesting energy from the electrical current on the distribution line 158 to be able to operate). However, the rate of wireless communication may vary depending on the amount of current on the distribution line 158. For example, a higher current (e.g., about 20 Amperes) may provide enough energy for the wireless current sensor (WCS) 184 to obtain electrical current measurements and send a wireless message about once every second. By contrast, a lower current (e.g., about 3 Amperes to 5 Amperes) may provide sufficient energy for the wireless current sensor (WCS) 184 to obtain electrical current measurements and send a wireless message about once every 20 seconds. In other words, the consistency of the wireless communication may be a better indicator of whether there has been an interruption in the wireless communication than the absolute rate.

As the wireless messages are received by the IED, the consistency of the wireless messages may be determined (block 204). Various examples how this may be done will be discussed in greater detail below with reference to FIG. 4. Continuing to review FIG. 3, if the wireless communication rate is consistent (e.g., has not changed more than some threshold, has not paused or stopped) (decision block 206), a first operational mode (e.g., first control method, first reliance on electrical measurements from the wireless electrical measurement device) for operating the IED 108 may be implemented (block 208). For example, the first mode may involve using a control method based on measurements of both electrical current and voltage. If the wireless communication rate has changed more than the threshold (decision block 206), however, a second operational mode (e.g., second control method, lower or no reliance on electrical measurements from the wireless electrical measurement device) for operating the IED 108 may be implemented (block 210). This is despite that the second operational mode may be suboptimal or less precise than the first. The second control method may involve operating the IED 108 without using the electrical current measurements from the wireless current sensor (WCS) 184. For example, the second control method may be a voltage-based control method that does not use current measurements or that weights current measurements less, or which is static (e.g., operating according to a defined schedule). The IED 108 may also inform other systems on the power distribution system, such as the SCADA system, that there has been a loss of communication with the wireless current sensor (WCS) 184 or that the communication has changed (e.g., indicating that the previous measurements of the wireless current sensor (WCS) 184 may no longer be presently valid) (block 212).

Using the example of the IED 108 as the capacitor bank controller (CBC) 192, the first control method may involve a control method that uses electrical current measurements. These may include, for example, a voltage-ampere-reactive (VAR) control method, a power factor control method, or a current control method, or some combination of these. A VAR control method may be carried out by determining the amount of reactive power present in a circuit, in which the reactive power is directly proportional to the electrical current and voltage, Using the VAR control method, the IED 108 may control the capacitor bank (CB) 188 to achieve a desired level of VARs on the distribution line 158. Similarly, a power factor control method may depend on the electrical current and voltage measurements. Power factor is the ratio between active power (due to resistive loads) and apparent power (combination of reactive power due to reactive loads and active power due to resistive loads). Using the power factor control method, the IED 108 may control the capacitor bank (CB) 188 to achieve a desired power factor on the distribution line 158. Meanwhile, using a current control method, the IED 108 may control the capacitor bank (CB) 188 to control a behavior of the current on the distribution line 158.

Continuing with the example of the IED 108 as the capacitor bank controller (CBC) 192, the second control method may involve a control method that does not use electrical current measurements or that weights electrical current measurements less than the first control method. Despite being suboptimal or less precise than the first method, the second control method may be preferred when the electrical current measurements from the wireless current sensor (WCS) 184 are unavailable or may no longer be valid for the present state of the distribution line 158 (e.g., when the rate of wireless messages changes dramatically). For example, the second control method may be a voltage-only control method that involves controlling the capacitor bank (CB) 188 to control a behavior of the voltage on the distribution line 158. Additionally or alternatively, the second control method may involve a static control method where the IED 108 controls the capacitor bank (CB) 188 according to a defined schedule (e.g., day vs. night) or based a set of ambient temperature that are measured using temperature sensors. It should be appreciated that any suitable control methods may be used as the first control method or the second control method and that these control methods have been provided above by way of example. Indeed, the control methods discussed herein are meant to be illustrative and not exhaustive examples of the types of control methods that may be used.

Figure 4:
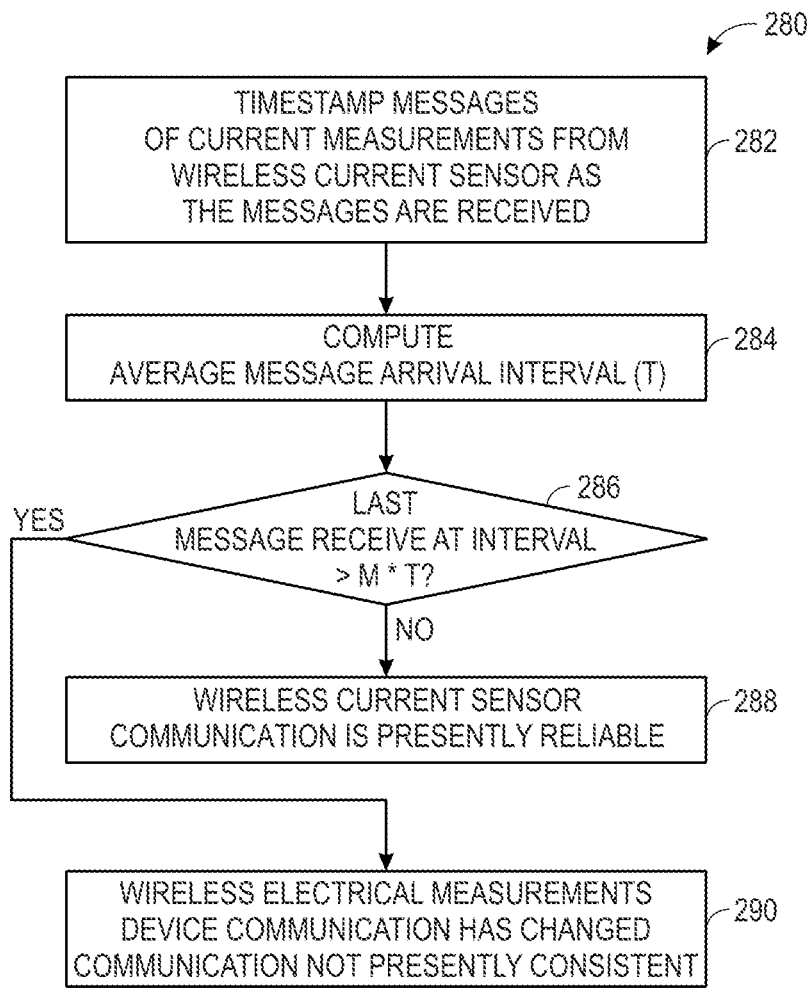
FIG. 4 is a flowchart of a process used to determine whether communication with a wireless electrical measurement device has suddenly changed, in accordance with an embodiment.

FIG. 4. is a flow chart of a process 280 to determine the consistency of wireless communication from a wireless electrical measurement device, such as a wireless current sensor (WCS) 184. Based on the consistency of the wireless communication, an IED, such as the IED 108, may determine whether to operate using a particular control method (e.g., a first control method or a second control method, as discussed above with reference to FIG. 3) or to determine whether to consider valid the electrical measurements received from the wireless electrical measurement device.

Considering the wireless current sensor (WCS) 184 by way of example, the wireless current sensor (WCS) 184 may obtain electrical current measurements at a faster rate when the current supplied on its respective distribution line is higher since it will harvest more energy with higher currents. On the other hand, the wireless current sensor (WCS) 184 may obtain electrical current measurements at a slower rate when the current supplied on its respective distribution line is lower. As such, the rate at which wireless messages are transmitted by the wireless current sensor (WCS) 184 to the IED 108 may change as conditions on the electrical distribution line 158 change. Thus, the interval between wireless messages may not be static.

To identify whether the wireless communication from a wireless electrical measurement device is consistent, an expected message arrival interval first may be determined. As electrical measurements are acquired, the wireless electrical measurement device may send a wireless message to the IED The IED may timestamp the wireless messages as they are received (block 282). Additionally or alternatively, the wireless messages themselves may contain a timestamp from the wireless electrical measurement device. Some number of recent timestamps may be stored (e.g., the number N referred to below).

To compute an expected wireless message arrival time (T) (block 284), the IED may compute an average (e.g., a weighted average) wireless message arrival time based on the arrival intervals of some number of recent wireless messages. In one example, digital filter(s) may determine the expected arrival interval. Furthermore, the expected wireless message arrival interval T may be computed as follows:

$$T = \frac{T_i - T_{i-N}}{N} \qquad \text{Eq. 1}$$

where $T_i$ represents a most recent arrival time and $T_{i-N}$ represents an arrival time N messages in the past. Any suitable number N of wireless messages may be used in computing the average arrival interval (e.g., 2, 3, 5, 10, 15, 20, 30, 50, 100, 150, 200, 300, 500, 1000, or higher). In some cases, the number N may be selected to be static. In some cases, the number N may be selected to vary depending on the previous value of the expected wireless message arrival interval (T). For example, when previous values of the expected wireless message arrival interval (T) have been shorter (e.g., the current on the distribution line 158 is higher, causing the wireless current sensor (WCS) 184 to harvest more energy and take more measurements), the number N may be selected to be higher. When previous values of the expected wireless message arrival interval (T) have been longer (e.g., the current on the distribution line 158 is lower, causing the wireless current sensor (WCS) 184 to harvest less energy and take fewer measurements), the number N may be selected to be lower.

In another example, the expected wireless message arrival interval T may be computed (block 284) as follows:

$$T = \sum_{i=x-N}^{x} (T_i - T_{i-1}) * W_i \qquad \text{Eq. 2}$$

where $T_i$ represents an arrival time for a message i, $T_{i-1}$ represents an arrival time for a message just prior to the message i, N represents the number of messages in the past over which to perform the calculation starting with a current message x, and $W_i$ represents a weighting coefficient between 0 and 1 that, over x-N to x sums to a desired value (e.g., 1). The weighting coefficient may be selected for equal weight for all N messages or may be selected to be different. For example, the weighting coefficient may be higher for more recent messages and lower for older messages (or vice versa) to more heavily weight more recent messages. Any other suitable computation may be used to determine the expected message arrival interval.

In another example, the expected wireless message arrival interval T may be computed (block 284) taking into account messages from each phase of power that may be measured by a respective wireless measurement device:

$$T_X = \frac{T_{i\_X} - T_{i\_X-N}}{N} \qquad \text{Eq. 3}$$

where X represents phase A, phase B, or phase C, $T_{i\_X}$ represents an arrival time for a message i corresponding to phase X, $T_{i\_X-N}$ represents an arrival time for a message N messages in the past. Any suitable number N of wireless messages may be used in computing the average arrival interval (e.g., 2, 3, 5, 10, 15, 20, 30, 50, 100, 150, 200, 300, 500, 1000, or higher). In some cases, the number N may be selected to be static. In some cases, the number N may be selected to vary depending on the previous value of the expected wireless message arrival interval (T). In some cases, the number N may vary by phase (e.g., depending on a historical consistency of messages from that phase). Additionally or alternatively, the number N may vary depending on a consistency of messages from other phases. For example, the number N may be lower when there has been a loss of communication with another phase, or vice versa.

Having obtained the expected message arrival interval (T), the IED may start a timer when a new message arrives. The timer may be set to some proportion M (e.g., multiple) of the expected wireless message arrival time (e.g., M*T). The proportion M may be any suitable value (e.g., 1.1, 1.2, 1.5, 2, 5, 10, 20, 50, 100, or higher). In some cases, the proportion M may be adaptive to the expected message arrival interval. For instance, the proportion M may be set to be higher when the expected message arrival interval is shorter. Conversely, the proportion M may be set to be lower when the expected message arrival interval is longer. In some cases, the proportion M may vary by phase (e.g., depending on a historical consistency of messages from that phase). Additionally or alternatively, the proportion M may vary depending on a consistency of messages from other phases. In one example, the proportion M may be lower when there has been a loss of communication with a wireless electrical measurement device of another phase and higher when wireless electrical measurement device of more or all phases have presently consistent wireless communication. In another example, the proportion M may be higher when there has been a loss of communication with a wireless electrical measurement device of another phase and lower when wireless electrical measurement device of more or all phases have presently consistent wireless communication.

If the next wireless message arrives before the timer expires (decision block 286), the IED may determine that the wireless communication is presently consistent (block 288) and the electrical measurements in the wireless messages can be relied upon as representing present electrical conditions of the power distribution system. If the timer ends before the next message is received (decision block 286), however, this may indicate that communication with the wireless electrical measurement device is paused or has stopped (e.g., has been interrupted) and may not be presently consistent (block 290). Under these conditions, as indicated by the process shown in FIG. 3, the IED may avoid using the electrical measurements from the wireless electrical measurement device and/or may generate an "loss of communication" alarm. By contrast, if a wireless message is received before the timer ends, wireless communication may be deemed to be consistent and the electrical measurements from the wireless electrical measurement device may considered as validly representing the present conditions on the distribution line.

In the event that the wireless communication is determined not to be presently consistent (block 290), some number of subsequent wireless messages may be received before the wireless communication may be considered consistent again. For example, the number N messages (e.g., 2, 3, 5, 10, 15, 20, 30, 50, 100, 150, 200, 300, 500, 1000, or higher) may be received consecutively (e.g., within some threshold of the latest arrival interval) before the wireless communication may be considered consistent again. Indeed, if only sporadic messages are received (e.g., not within some threshold value or proportion of the latest arrival interval), the IED may not use the electrical measurements received in those messages. Additionally or alternatively, the IED may generate an "unreliable communication" alarm to notify the SCADA system.

Figure 5:
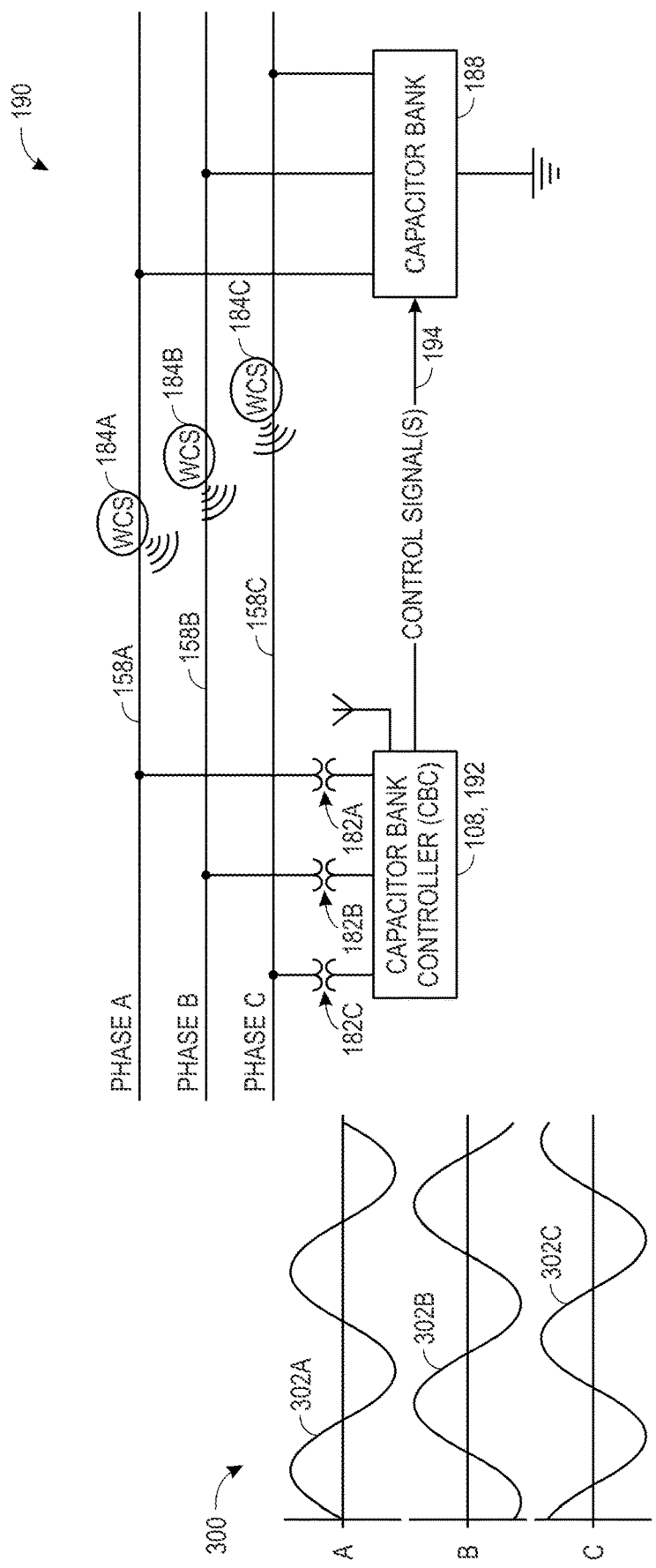
FIG. 5 is a block diagram of three wireless current sensors on three respective phases in which all three are in communication with an IED (i.e., capacitor bank controller) of the electric power distribution system, in accordance with an embodiment.

For multiphase power transmission (e.g., 2-phase or 3-phase power), the IED may be able to determine whether there is a loss of wireless communication or not based on loss of current or an absence of current (i.e., open phase). For example, if there is an absence of current and the IED may not be able to sense voltage, then there is no loss of wireless communication. However, if there is a loss of current and voltages may still be present, then the IED may determine a loss of wireless communication. When the wireless electrical measurement devices for all phases of power on a distribution line have presently consistent wireless communication with an IED, the IED may be able to use all of the presently received electrical measurements to control an aspect of the power distribution system. An example of this appears in the three-phase arrangement 190 illustrated in FIG. 5. In FIG. 5, there are three wireless electrical measurement devices (wireless current sensors (WCSs) 184A, 184B, and 184C) that measure electrical current on three respective phases A, B, and C carried by different conductors of the distribution line 158 (158A, 158B, and 158C). There may also be three corresponding potential transformers 182A, 182B, and 182C to obtain voltage measurements for the three respective phases A, B, and C. In FIG. 5, the IED 108 is shown to represent the capacitor bank controller (CBC) 192 that may receive wireless messages from the wireless current sensors (WCSs) 184A, 184B, and 184C via its antenna 186. Thereafter, the IED 108 (e.g., capacitor bank controller (CBC) 192) may use any suitable control method to issue control signals 194 to control the capacitor bank (CB) 188.

The IED 108 (e.g., capacitor bank controller (CBC) 192) may have stored in its memory or other storage device certain electrical measurements 300 based on the electrical measurements received from the wireless electrical measurement devices (the wireless current sensors (WCSs) 184A, 184B, and 184C). Since the IED 108 (e.g., capacitor bank controller (CBC) 192) has presently consistent communication for all phases of power, the IED 108 (e.g., capacitor bank controller (CBC) 192) may have a presently accurate representation of the state of all three phases being measured by the wireless electrical measurement devices (the wireless current sensors (WCSs) 184A, 184B, and 184C). In FIG. 5, these electrical measurements are represented by a phase A electrical current waveform 302A, a phase B electrical current waveform 302B, and a phase C electrical current waveform 302C. Three-phase power generally involves three alternating-current (AC) electrical waveforms that are offset from one another in phase by about 120°. The three-phase power waveforms are generally similar to one another, though there may be some variation in magnitude or harmonics from phase to phase. Thus, when there is consistent wireless communication with the wireless electrical measurement devices for these measurements, the particular phase offsets, magnitude, and/or harmonics particular to each phase may be obtained as measurements from the wireless electrical measurement devices.

Figure 6:
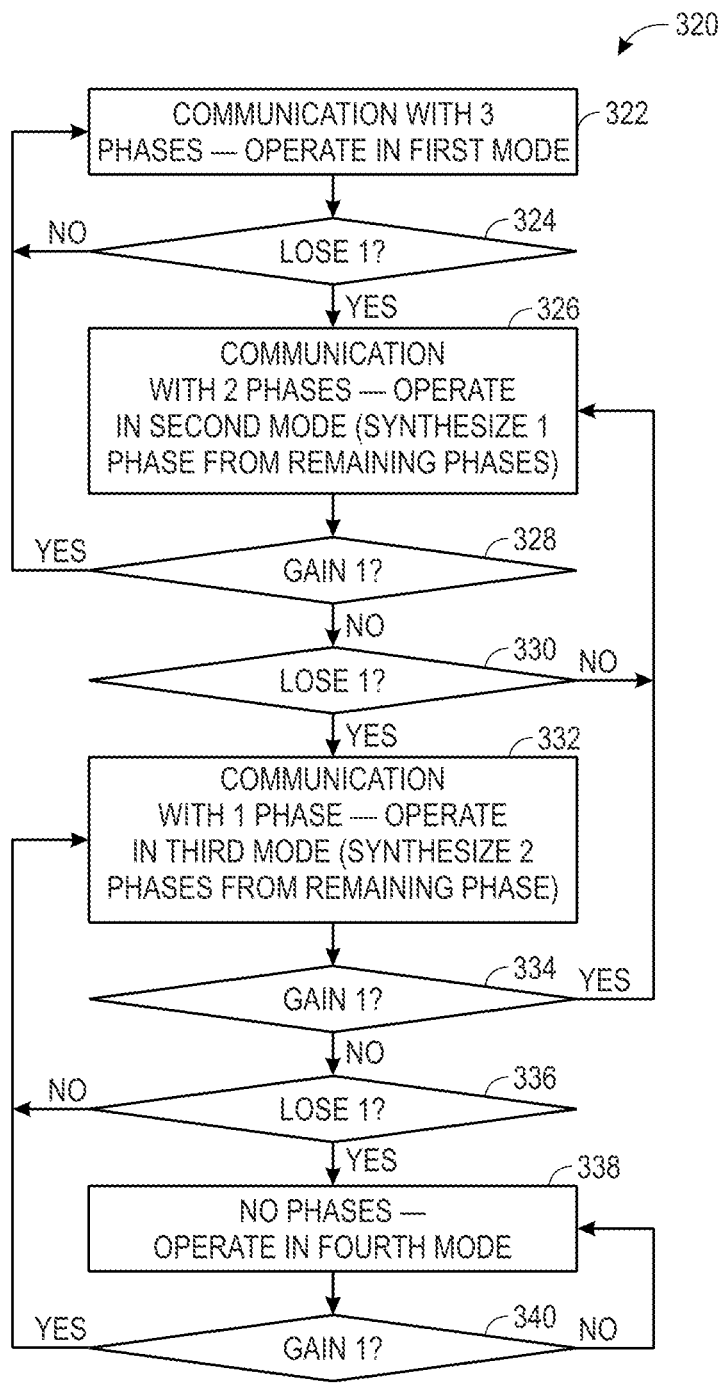
FIG. 6 is a flowchart of a process used to determine an operation mode for operating an IED based on communication from three wireless electrical measurement devices on three respective phases, in accordance with an embodiment.

As provided by a flow chart of a process 320 shown in FIG. 6, an IED may operate in a first mode (e.g., using a first control method) when there is communication with all three phases (block 322). Using the example of the IED 108 as the capacitor bank controller (CBC) 192, the first mode may involve using a first control method that uses electrical current measurements. These may include, for example, a voltage-ampere-reactive (VAR) control method, a power factor control method, or a current control method, or some combination of these. The first control method may involve controlling an aspect of each phase individually based on the respective electrical measurements for that phase. For example, the TED 108 as capacitor bank controller (CBC) 192 may independently control the switching of capacitors in the capacitor bank 188 for phase A on the distribution line 158A using the phase A electrical current waveform 302A, for phase B on the distribution line 158B using the phase B electrical current waveform 302B, and for phase C on the distribution line 158C using the phase C electrical current waveform 302C. This may continue (decision block 324) unless presently consistent communication is lost on one of the phases.

When presently consistent communication is lost for one of the phases, reducing present electrical measurements from 3 phases to 2 phases (decision block 324), the IED may operate in a second mode and/or may synthesize the electrical measurements of the lost phase using measurements for the remaining phases (block 326). The TED may also issue a "loss of communication" alarm for the lost phase. The second mode may also involve using the first control method that uses electrical current measurements, but may, additionally or alternatively, involve a different control method. The second mode may also involve synthesizing the electrical measurements for the missing phase using the electrical measurements for the remaining phases.

Figure 7:
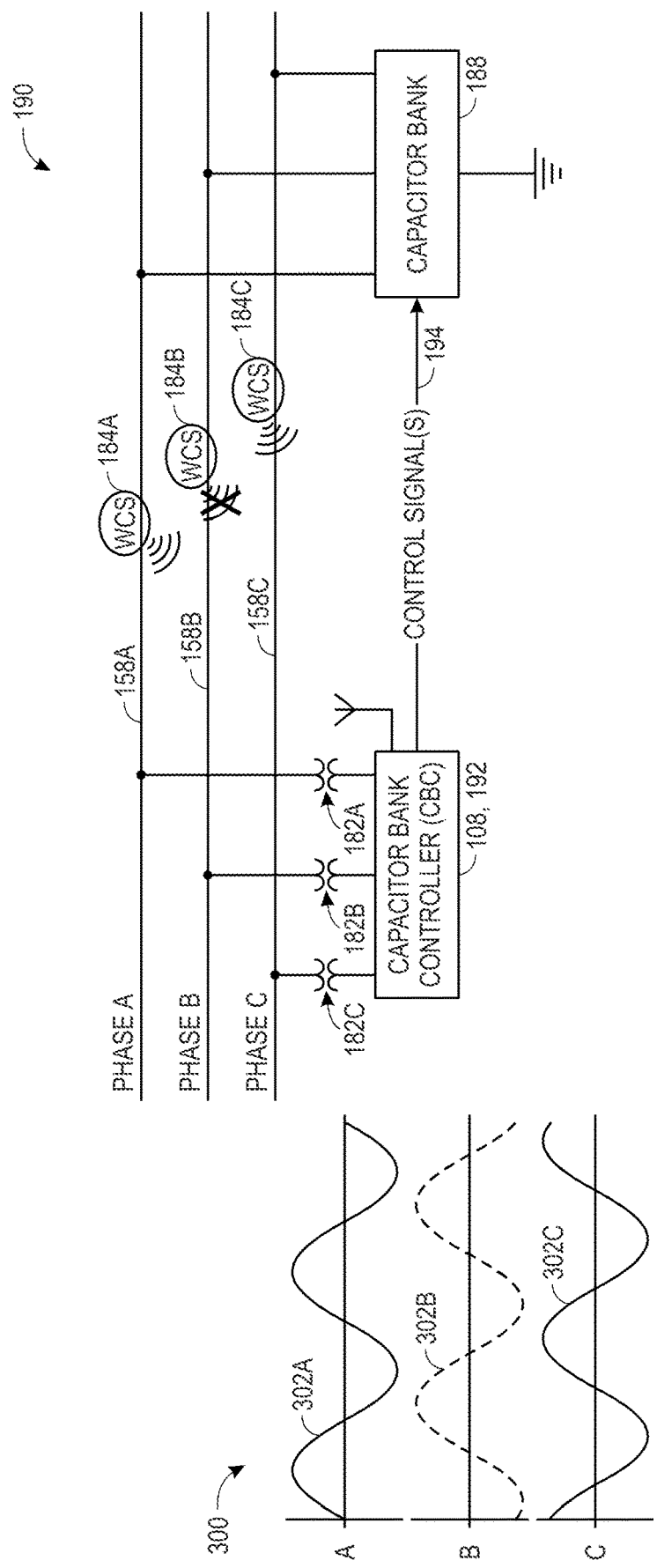
FIG. 7 is a block diagram of three wireless current sensors on three respective phases in which all three are in communication with a capacitor bank controller of the electric power distribution system, in accordance with an embodiment.

FIG. 7 provides an example of an IED synthesizing a lost phase in the event of a loss of wireless communication for that phase. In FIG. 7, there is a loss of wireless communication (e.g., lack of presently consistent wireless communication) with the wireless current sensor (WCS) 184B on the distribution line 158B. As a consequence, the IED 108 (e.g., capacitor bank controller (CBC) 192) does not have present electrical current measurements for the phase B electrical current waveform 302B. Instead, the IED 108 (e.g., capacitor bank controller (CBC) 192) may synthesize the phase B electrical current waveform 302B based on the phase A electrical current waveform 302A and the phase C electrical current waveform 302C. In one example, the magnitude of the synthesized phase B electrical current waveform 302B may be an average of the magnitudes of the phase A electrical current waveform 302A and the phase C electrical current waveform 302C. The phase offset of the synthesized phase B electrical current waveform 302B may be selected to be 120° from a phase offset of the phase A electrical current waveform 302A and the phase C electrical current waveform 302C and/or equidistant from the phase offset of the phase A electrical current waveform 302A and the phase C electrical current waveform 302C (e.g., the phase offset of the synthesized waveform may be selected to be equally offset between the phase offsets of the measured waveforms). In some examples, the IED 108 (e.g., capacitor bank controller (CBC) 192) may take into account a historical relationship between the phases (e.g., that the magnitude of the phase B electrical current waveform 302B has historically been 10% higher than that of the phase A electrical current waveform 302A or the phase C electrical current waveform 302C). The IED 108 (e.g., capacitor bank controller (CBC) 192) may, additionally or alternatively, take into account a historical behavior of the lost phase. For example, if the phase B electrical current waveform 302B historically exhibited certain harmonics, the IED 108 (e.g., capacitor bank controller (CBC) 192) may include those harmonics in the synthesized phase B electrical current waveform 302B.

Returning to FIG. 6, if wireless communication returns for the missing phase (e.g., presently consistent wireless communication is reestablished) (decision block 328), the IED may again operate in the first mode (e.g., using the first control method) as there is communication with all three phases (block 322). If wireless communication continues to be lost for the missing phase (decision block 328) and wireless communication remains for the remaining phases (e.g., remains presently consistent) (decision block 330), the IED may continue to operate in the second mode and/or may synthesize the electrical measurements of the lost phase using measurements for the remaining phases (block 326).

When presently consistent communication is lost for another of the phases, reducing present electrical measurements from 2 phases to 1 phase (decision block 330), the IED may operate in a third mode and/or may synthesize the electrical measurements of the lost phases using measurements for the remaining phase (block 332). The IED may also issue a "loss of communication" alarm for the lost phase. The third mode may involve using the first control method or a different control method (e.g., which may be the same or different from the first mode or the second mode). The third mode may also involve synthesizing the electrical measurements for the missing phases using the electrical measurements for the remaining phase.

Figure 8:
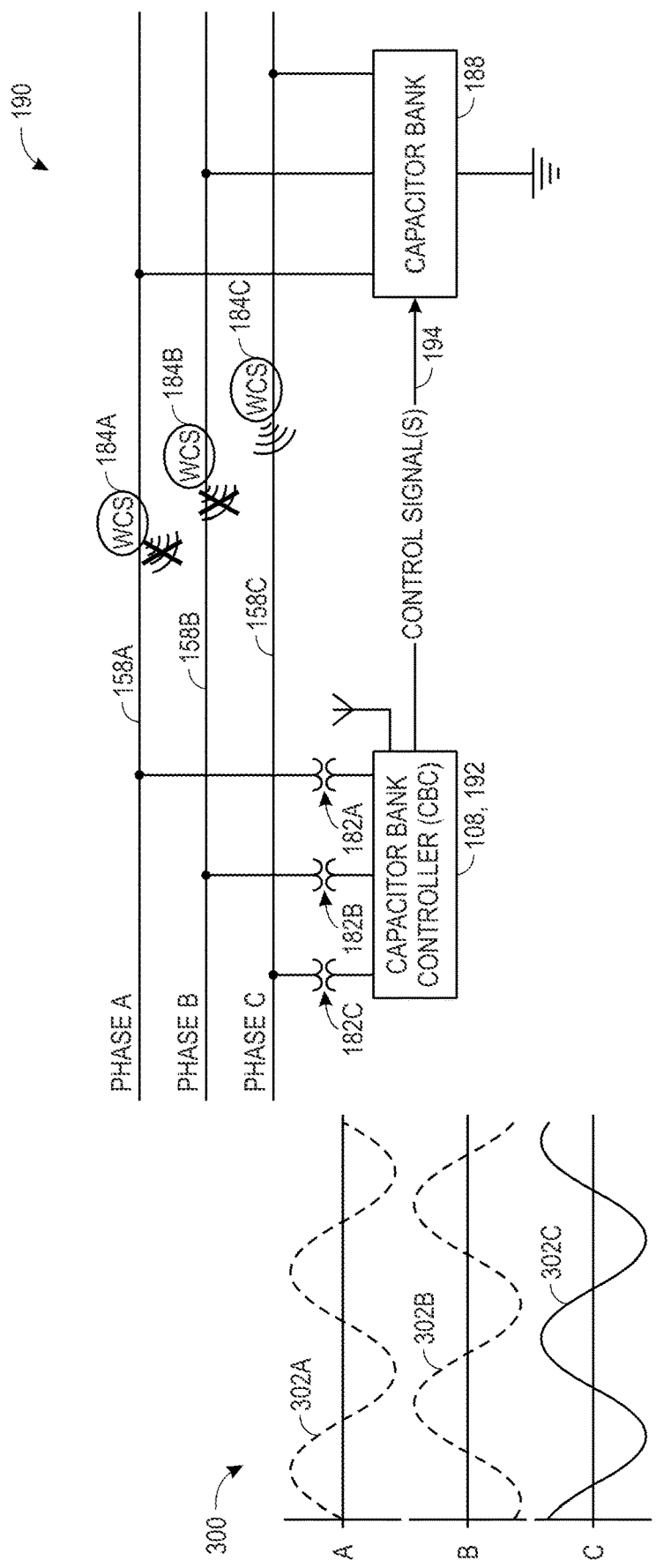
FIG. 8 is a block diagram of three wireless current sensors on three respective phases in which all three are in communication with a capacitor bank controller of the electric power distribution system, in accordance with an embodiment.

FIG. 8 provides an example of an IED synthesizing two lost phases in the event of a loss of wireless communication for those phases. In FIG. 8, there is a loss of wireless communication (e.g., lack of presently consistent wireless communication) with the wireless current sensor (WCS) 184B on the distribution line 158B and with the wireless current sensor (WCS) 184A on the distribution line 158A. As a consequence, the IED 108 (e.g., capacitor bank controller (CBC) 192) does not have present electrical current measurements for the phase B electrical current waveform 302B or the phase A electrical current waveform 302A. Instead, the IED 108 (e.g., capacitor bank controller (CBC) 192) may synthesize the phase B electrical current waveform 302B and the phase A electrical current waveform 302A using the phase C electrical current waveform 302C. In one example, the magnitude of the synthesized phase B electrical current waveform 302B and the phase A electrical current waveform 302A may be selected to be the same as the phase C electrical current waveform 302C. The phase offsets may be selected to be 240° ahead and 120° ahead, respectively. In some examples, the IED 108 (e.g., capacitor bank controller (CBC) 192) may take into account a historical relationship between the phases. For example, if the magnitude of the phase B electrical current waveform 302B has historically been 10% higher than that of the phase A electrical current waveform 302A and the phase C electrical current waveform 302C, the IED 108 (e.g., capacitor bank controller (CBC) 192) may synthesize the phase A electrical waveform 302A to be equal to the magnitude of the phase C electrical current waveform 302C, and may synthesize the phase B electrical current waveform 302B to be 10% higher than the phase C electrical current waveform 302C. The IED 108 (e.g., capacitor bank controller (CBC) 192) may, additionally or alternatively, take into account a historical behavior of the lost phases. For example, if the phase B electrical current waveform 302B historically exhibited certain harmonics, the IED 108 (e.g., capacitor bank controller (CBC) 192) may include those harmonics in the synthesized phase B electrical current waveform 302B.

Returning again to FIG. 6, if wireless communication returns for one of the missing phases (e.g., presently consistent wireless communication is reestablished) (decision block 334), the IED may again operate in the second mode (e.g., using the second control method) as there is communication with two phases and one electrical measurements from one phase may be synthesized (block 326). If wireless communication continues to be lost for the two missing phases (decision block 334) and wireless communication remains for the remaining phases (e.g., remains presently consistent) (decision block 336), the IED may continue to operate in the third mode and/or may synthesize the electrical measurements of the lost phases using measurements for the remaining phase (block 332).

Figure 9:
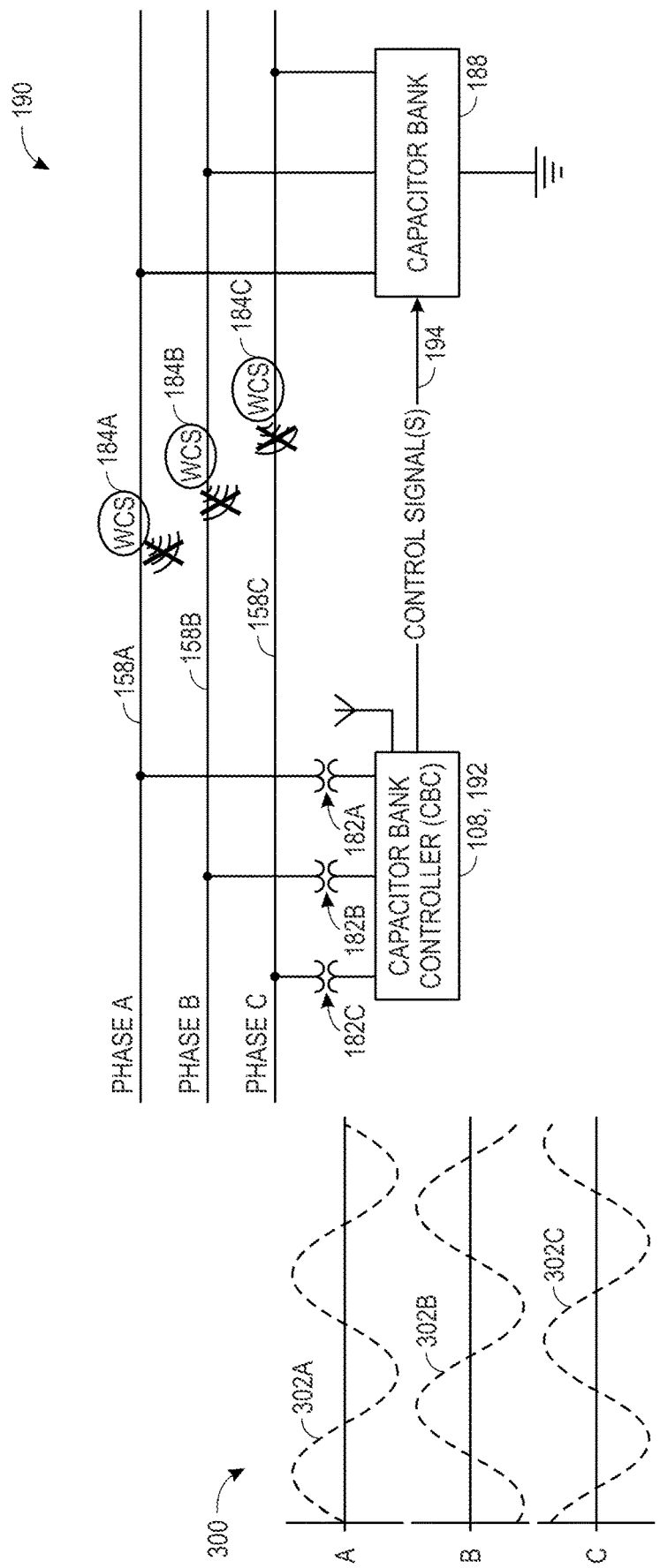
FIG. 9 is a block diagram of three wireless current sensors on three respective phases in which all three are in communication with a capacitor bank controller of the electric power distribution system, in accordance with an embodiment.

When presently consistent communication is lost for another of the phases, reducing present electrical measurements from 1 phase to none (decision block 336), the IED may operate in a fourth mode (block 338). The IED may also issue a "loss of communication" alarm for the lost phase. The fourth mode may involve using the first control method, but generally may involve using a control method that does not use the electrical measurements for the missing phases. Indeed, as illustrated in FIG. 9, there is a loss of wireless communication (e.g., lack of presently consistent wireless communication) with the wireless current sensor (WCS) 184B on the distribution line 158B and with the wireless current sensor (WCS) 184A on the distribution line 158A. As a consequence, the IED 108 (e.g., capacitor bank controller (CBC) 192) does not have present electrical current measurements for the phase A electrical current waveform 302A, the phase B electrical current waveform 302B, or the phase C electrical current waveform 302C. As shown in FIG. 6, the IED may continue to operate in the fourth mode while consistent communication does not return for any phases (decision block 340). If wireless communication returns for one of the missing phases (e.g., presently consistent wireless communication is reestablished) (decision block 340), the IED may again operate in the third mode as there is communication with one phase and two electrical measurements may be synthesized (block 332).

In some cases, the mode of operation may vary depending on whether communication was recently lost or whether communication was recently gained. One example appears as a flowchart of a process 350 of FIG. 10. The process 350 of FIG. 10 shares blocks 322, 324, 326, 328, 330, 332, 334, 336, 338, and 340 with the process 320 of FIG. 6. As such, descriptions of these blocks may be found in the text above with reference to FIG. 6. In addition, however, the process 350 of FIG. 10 includes blocks 352, 354, and 356. Namely, after communication has been lost for one phase and the IED operates in the second mode (block 326) and communication for one phase is subsequently gained (decision block 328), the IED may not immediately return to operate in the first mode (block 322). Instead, the IED may operate in a fifth mode (block 352), which may differ from the first mode. The fifth mode may be less precise or less accurate than the first mode, but may be more tolerant of a subsequent loss of communication of the same phase again or may allow for a buildup of historical electrical measurements for the phase for which wireless communication was previously missing. The IED may operate in the fifth mode for some amount of time (e.g., several minutes, an hour, a day) or some number of messages (e.g., 100, 1000, 10,000 messages). After consistently receiving electrical measurements for the amount of time or number of messages, the IED may transition to operate in the first mode (block 322).

Likewise, after communication has been lost for two phases and the IED operates in the third mode (block 332) and communication for one phase is subsequently gained (decision block 334), the IED may not immediately return to operate in the second mode (block 326). Instead, the IED may operate in a sixth mode (block 354), which may differ from the second mode. The sixth mode may be less precise or less accurate than the second mode, but may be more tolerant of a subsequent loss of communication of the same phase again or may allow for a buildup of historical electrical measurements for the phase for which wireless communication was previously missing and has now returned. The IED may operate in the sixth mode for some amount of time (e.g., several minutes, an hour, a day) or some number of messages (e.g., 100, 1000, 10,000 messages). After consistently receiving electrical measurements for the amount of time or number of messages, the IED may transition to operate in the second mode (block 326). And after communication has been lost for all three phases and the IED operates in the fourth mode (block 338) and communication for one phase is subsequently gained (decision block 340), the IED may not immediately return to operate in the third mode (block 332). Instead, the TED may operate in a seventh mode (block 356), which may differ from the third mode. The seventh mode may be less precise or less accurate than the third mode, but may be more tolerant of a subsequent loss of communication of the same phase again or may allow for a buildup of historical electrical measurements for the phase for which wireless communication was previously missing. The TED may operate in the seventh mode for some amount of time (e.g., several minutes, an hour, a day) or some number of messages (e.g., 100, 1000, 10,000 messages). After consistently receiving electrical measurements for the amount of time or number of messages, the TED may transition to operate in the third mode (block 332).

Figure 10:
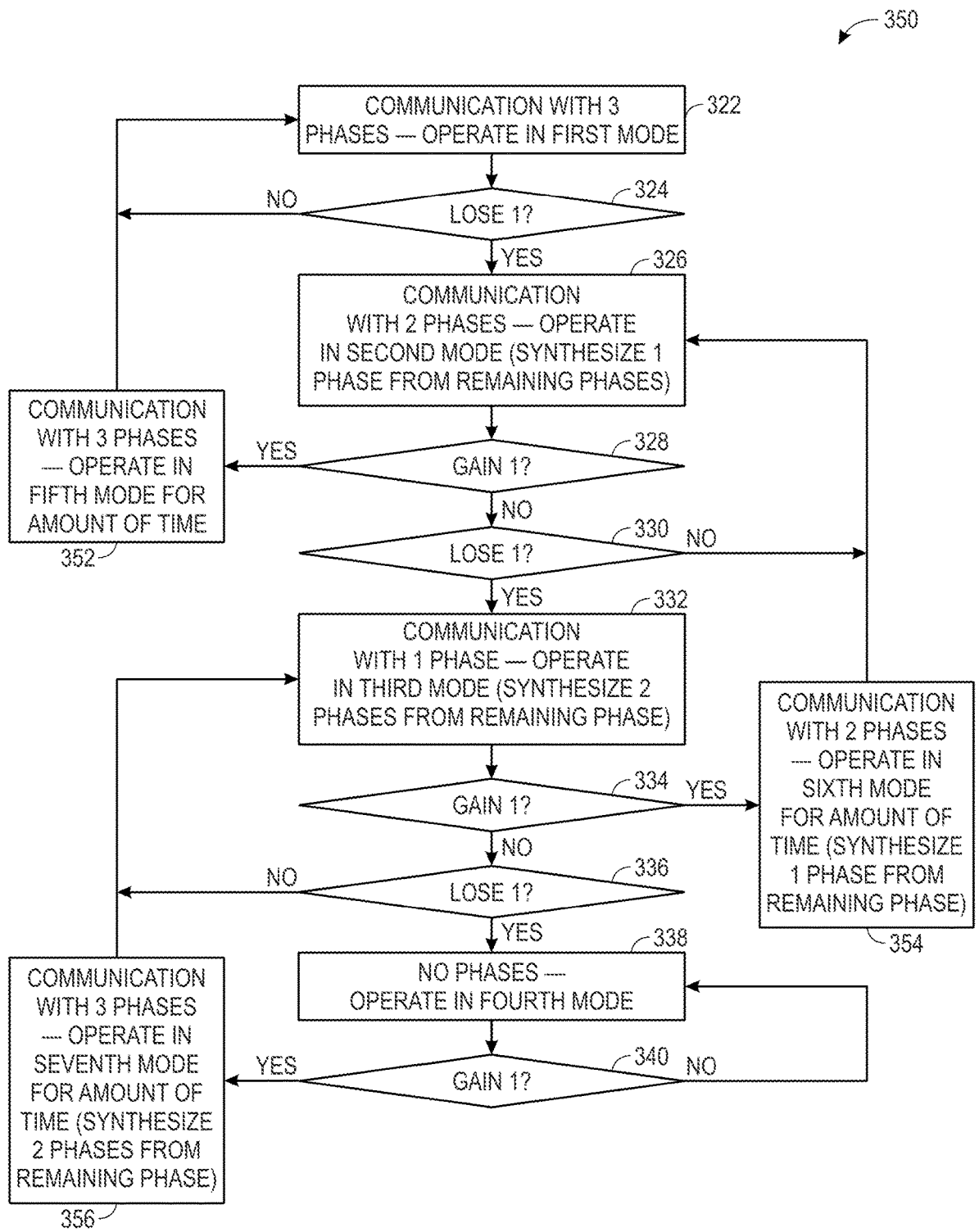
FIG. 10 is a flowchart of another process used to determine an operation mode for operating an IED based on communication from three wireless electrical measurement devices on three respective phases, in accordance with an embodiment.

With respect to FIGS. 6 and 10, the various modes of operation for the TED may be selected to account for the various electrical measurements available and/or the level of trust that may be applied to the present communication with the wireless electrical measurement devices. Several examples will follow, but it should be appreciated that these are meant to be illustrative and not exhaustive.

In one example, the first mode of operation, the second mode of operation, the third mode of operation, the fifth mode of operation, the sixth mode of operation, and the seventh mode of operation may all involve the same control method in which an electrical component for each phase is controlled independently based on the measurements for that respective phase. For example, a capacitor bank controller may control capacitors of a capacitor bank independently by phase using the electrical current and/or voltage measurements for that phase, including for any phases that are synthesized. The fourth mode of operation may involve a control method that does not rely on the electrical measurements for the phases that have been lost. For example, the fourth mode of operation may involve voltage control of a capacitor bank when all three phases of wireless current sensors lose communication with the TED In another example, different of the first mode of operation, the second mode of operation, the third mode of operation, the fifth mode of operation, the sixth mode of operation, and the seventh mode of operation may involve the same or different control methods.

In another example, the first mode of operation may involve a first control method in which an electrical component for each phase is controlled independently based on the measurements for that respective phase. For example, a capacitor bank controller may control capacitors of a capacitor bank independently by phase using the electrical current and/or voltage measurements for that phase. The second mode of operation may involve the same first control method in which an electrical component for each phase is controlled independently based on the measurements for that respective phase, including for the phase that is synthesized. The third mode of operation may involve the same first control method in which an electrical component for each phase is controlled independently based on the measurements for that respective phase, including for the phases that are synthesized. The fourth mode of operation may involve a control method that does not rely on the electrical measurements for the phases that have been lost.

In another example, the first mode of operation may involve a first control method in which an electrical component for each phase is controlled independently based on the measurements for that respective phase, but the second and third modes of operation may involve a control method in which the electrical component for each phase is controlled in the same way based on the electrical measurements. For example, the capacitor bank controller may control capacitors of a capacitor bank collectively in ganged configuration using the electrical current and/or voltage measurements that are available. Indeed, in some cases, the missing phases may not be synthesized. The fourth mode of operation may involve a control method that does not rely on the electrical measurements for the phases that have been lost.

In another example, the first mode and second mode may involve a first control method in which an electrical component for each phase is controlled independently based on the measurements for that respective phase, but the third mode may involve a control method in which the electrical component for each phase is controlled in the same way based on the electrical measurements. For example, the capacitor bank controller may control capacitors of a capacitor bank collectively in ganged operation using the electrical current and/or voltage measurements that are available. Indeed, in some cases, the missing phases may not be synthesized. The fourth mode of operation may involve a control method that does not rely on the electrical measurements for the phases that have been lost.

In another example, the first mode of operation may involve a control method in which an electrical component for each phase is controlled independently based on the measurements for that respective phase (e.g., phase-by-phase control of a capacitor bank), while the fifth mode may involve a control method in which the electrical component for each phase is controlled in the same way based on the electrical measurements (e.g., ganged control of the capacitor bank).

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. One or more tangible non-transitory computer-readable media comprising instructions that, when executed by a processor of an intelligent electronic device configured to control at least part of an electric power distribution system, cause the processor to:
    operate the intelligent electronic device that comprises the processor according to a first mode when the intelligent electronic device has wireless communication with:
    a first wireless electrical measurement device that obtains first electrical measurements of a first phase on a first distribution line of the electric power distribution system;
    a second wireless electrical measurement device that obtains second electrical measurements of a second phase on a second distribution line of the electric power distribution system; and
    a third wireless electrical measurement device that obtains third electrical measurements of a third phase on a third distribution line of the electric power distribution system; and
    operate the intelligent electronic device according to a second mode when the intelligent electronic device has lost the wireless communication with one of the first wireless electrical measurement device, the second wireless electrical measurement device, and the third wireless electrical measurement device while remaining in the wireless communication with two of the first wireless electrical measurement device, the second wireless electrical measurement device, and the third wireless electrical measurement device.

2. The one or more tangible computer-readable media of claim 1, comprising the instructions that, when executed by the processor, cause the processor to:
    operate the intelligent electronic device according to a third mode when the intelligent electronic device has lost the wireless communication with two of the first wireless electrical measurement device, the second wireless electrical measurement device, and the third wireless electrical measurement device while remaining in the wireless communication with one of the first wireless electrical measurement device, the second wireless electrical measurement device, and the third wireless electrical measurement device.

3. The one or more tangible computer-readable media of claim 2, wherein the intelligent electronic device may operate in a seventh mode, wherein the seventh mode differs from the third mode, for a threshold amount of time, in response to one phase of the first phase, the second phase and the third phase gained after the wireless communication has been lost for three phases of the first phase, the second phase and the third phase and the intelligent electronic device is operating in a fourth mode, wherein the fourth mode differs from the seventh mode.

4. The one or more tangible computer-readable media of claim 1, comprising the instructions that, when executed by the processor, cause the processor to:
operate the intelligent electronic device according to a fourth mode when the intelligent electronic device has lost the wireless communication with all three of the first wireless electrical measurement device, the second wireless electrical measurement device, and the third wireless electrical measurement device.

5. The one or more tangible computer-readable media of claim 1, wherein the instructions to operate the intelligent electronic device according to the first mode comprise first instructions to control a capacitor bank by phase, and wherein the instructions to operate the intelligent electronic device according to the second mode comprise second instructions to control the capacitor bank in a ganged configuration.

6. The one or more tangible computer-readable media of claim 1, wherein the instructions to operate the intelligent electronic device according to the second mode comprises second instructions to synthesize the first, second and third electrical measurements of one or more phases of the first phase, the second phase and the third phase for which the wireless communication was lost based at least in part on the first, second and third phases for which the wireless communication remains.

7. The one or more tangible computer-readable media of claim 1, wherein the intelligent electronic device may operate in a fifth mode, wherein the fifth mode differs from the first mode, for a threshold amount of time, in response to one phase of the first phase, the second phase and the third phase gained after the wireless communication has been lost for the one phase of the first phase, the second phase and the third phase and the intelligent electronic device is operating in the second mode.

8. The one or more tangible computer-readable media of claim 1, wherein the intelligent electronic device may operate in a sixth mode, wherein the sixth mode differs from the second mode, for a threshold amount of time, in response to one phase of the first phase, the second phase and the third phase gained after the wireless communication has been lost for two phases of the first phase, the second phase and the third phase and the intelligent electronic device is operating in a third mode, wherein the third mode differs from the second mode.

* * * * *